United States Patent
Dahiya et al.

(10) Patent No.: US 11,581,850 B2
(45) Date of Patent: Feb. 14, 2023

(54) SYSTEM FOR ENABLING EXTERNAL OSCILLATORS IN SYSTEM-ON-CHIPS

(71) Applicant: NXP USA, Inc., Austin, TX (US)

(72) Inventors: Atul Dahiya, Gurgaon (IN); Krishna Thakur, GautamBudh Nagar (IN); Deependra Kumar Jain, Noida (IN)

(73) Assignee: NXP USA, INC., Austin, TX (US)

( * ) Notice: Subject to any disclaimer, the term of this patent is extended or adjusted under 35 U.S.C. 154(b) by 282 days.

(21) Appl. No.: 17/103,871

(22) Filed: Nov. 24, 2020

(65) Prior Publication Data
US 2022/0166380 A1   May 26, 2022

(51) Int. Cl.
*H03B 5/06*   (2006.01)
*H03B 5/36*   (2006.01)

(52) U.S. Cl.
CPC ............... *H03B 5/06* (2013.01); *H03B 5/364* (2013.01)

(58) Field of Classification Search
CPC ..... H03B 5/06; H03B 5/364; H03K 19/00369
See application file for complete search history.

(56) References Cited

U.S. PATENT DOCUMENTS

2021/0255659 A1*   8/2021   Chen .................... G06F 1/06

\* cited by examiner

*Primary Examiner* — Jeffrey M Shin

(57) ABSTRACT

An enabling system that includes a controller and processing circuitry, is configured to enable an external oscillator that operates in one of single-ended, differential, and crystal modes. To enable the external oscillator, the controller is configured to detect a mode of operation of the external oscillator, and the processing circuitry is configured to operate in the detected mode. The controller detects the mode of operation of the external oscillator by sequentially initializing the processing circuitry to operate in the single-ended, differential, and crystal modes, and determining whether the current operating mode of the processing circuitry is same as the mode of operation of the external oscillator based on a clock signal outputted by the processing circuitry during the corresponding mode.

20 Claims, 5 Drawing Sheets

SYSTEM FOR ENABLING EXTERNAL OSCILLATORS IN SYSTEM-ON-CHIPS

BACKGROUND

The present disclosure relates generally to electronic circuits, and, more particularly, to a system for enabling external oscillators in system-on-chips.

Typically, system-on-chips (SoCs) are coupled with external oscillators (i.e., oscillators that are external to the SoCs) for receiving various clock signals. The received clock signals are then utilized by the SoCs for executing various synchronous operations associated therewith. An external oscillator may operate in a single-ended mode, a differential mode, or a crystal mode. To utilize the external oscillator (i.e., one or more clock signals generated by the external oscillator) in an SoC, it is required to enable the external oscillator in the SoC. The SoC includes an enabling system for enabling the external oscillator in the SoC. The enabling system enables the external oscillator by operating in a same mode as that of the external oscillator. It is paramount for the enabling system to accurately enable the external oscillator as a mismatch between the operating modes of the external oscillator and the enabling system may lead to utilization of an unstable clock signal in the SoC, and in turn, an operational failure of the SoC. For example, if the enabling system operates in the crystal mode when the external oscillator is operating in the differential or single-ended mode, the resultant clock signal is unstable, and hence, leads to the operational failure of the SoC.

To operate in a same mode as that of the external oscillator, the enabling system is required to identify the operating mode of the external oscillator. It is difficult for the enabling system to identify the operating mode of the external oscillator when the SoC is unprogrammed (e.g., when information associated the external oscillator is unavailable to the enabling system). In such a scenario, the enabling system is required to include one or more pads that are utilized for identifying the operating mode of the external oscillator. For example, logic states of such pads are indicative of the operating mode of the external oscillator. However, the usage of such pads in the enabling system leads to an increase in a size and a manufacturing cost of the enabling system. The increase in the size and the manufacturing cost of the enabling system further leads to an increase in a size and a manufacturing cost of the SoC, respectively. Therefore, there exists a need for a technical solution that solves the aforementioned problems of existing enabling systems that enable external oscillators in SoCs.

SUMMARY

In one embodiment of the present disclosure, an enabling system for enabling an external oscillator is disclosed. The enabling system includes a controller and processing circuitry. The controller is configured to detect a mode of operation of the external oscillator. The mode of operation includes one of first through third modes. The first through third modes correspond to single-ended, differential, and crystal modes, respectively. The processing circuitry is coupled with the controller, and configured to operate in the detected mode for enabling the external oscillator. The processing circuitry includes a clock circuit, a pull-down circuit, and a common-mode circuit. The clock circuit is coupled with the external oscillator, and configured to receive at least one of first and second clock signals, and output a third clock signal. The pull-down circuit is coupled between the external oscillator and ground, and configured to receive and pull down the second clock signal to ground. The pull-down circuit is activated when the processing circuitry operates in the first mode, and deactivated when the processing circuitry operates in the second and third modes. The common-mode circuit is coupled with the clock circuit, and configured to generate and provide a common-mode voltage to the clock circuit. The third clock signal is further outputted by the clock circuit based on the common-mode voltage. The common-mode circuit is activated when the processing circuitry operates in the second mode, and deactivated when the processing circuitry operates in the first and third modes.

In another embodiment of the present disclosure, a system-on-chip (SoC) is disclosed. The SoC includes an enabling system and digital circuitry. The enabling system is configured to enable an external oscillator that operates in one of first through third modes. The first through third modes correspond to single-ended, differential, and crystal modes, respectively. The enabling system includes a controller that is configured to detect a mode of operation of the external oscillator, and processing circuitry that is coupled with the controller, and configured to operate in the detected mode for enabling the external oscillator. The processing circuitry includes a clock circuit that is coupled with the external oscillator, and configured to receive at least one of first and second clock signals, and output a third clock signal. The processing circuitry further includes a pull-down circuit that is coupled between the external oscillator and ground, and configured to receive and pull down the second clock signal to ground. The pull-down circuit is activated when the processing circuitry operates in the first mode, and deactivated when the processing circuitry operates in the second and third modes. The processing circuitry further includes a common-mode circuit that is coupled with the clock circuit, and configured to generate and provide a common-mode voltage to the clock circuit. The third clock signal is further outputted by the clock circuit based on the common-mode voltage. The common-mode circuit is activated when the processing circuitry operates in the second mode, and deactivated when the processing circuitry operates in the first and third modes. The digital circuitry is coupled with the clock circuit of the enabling system, and configured to receive the third clock signal, and execute one or more synchronous operations.

In yet another embodiment of the present disclosure, an electronic circuit board is disclosed. The electronic circuit board includes an external oscillator that is configured to operate in one of first through third modes, and generate at least one of first and second clock signals. The first through third modes correspond to single-ended, differential, and crystal modes, respectively. The electronic circuit board further includes an enabling system that is coupled with the external oscillator, and configured to enable the external oscillator. The enabling system includes a controller that is configured to detect a mode of operation of the external oscillator, and processing circuitry that is coupled with the controller, and configured to operate in the detected mode for enabling the external oscillator. The processing circuitry includes a clock circuit that is coupled with the external oscillator, and configured to receive at least one of the first and second clock signals, and output a third clock signal. The processing circuitry further includes a pull-down circuit that is coupled between the external oscillator and ground, and configured to receive and pull down the second clock signal to ground. The pull-down circuit is activated when the processing circuitry operates in the first mode, and deactivated when the processing circuitry operates in the second and third modes. The processing circuitry further includes a common-mode circuit that is coupled with the clock circuit, and configured to generate and provide a common-mode voltage to the clock circuit. The third clock signal is further outputted by the clock circuit based on the common-mode voltage. The common-mode circuit is activated when the processing circuitry operates in the second mode, and deactivated when the processing circuitry operates in the first and third modes.

In some embodiments, the controller is further configured to generate first and second control signals such that the first control signal is activated when the processing circuitry operates in the first mode, and deactivated when the processing circuitry operates in the second and third modes, and the second control signal is activated when the processing circuitry operates in the second mode, and deactivated when the processing circuitry operates in the first and third modes. The pull-down circuit and the common-mode circuit are further coupled with the controller, and further configured to receive the first and second control signals, respectively. The pull-down circuit and the common-mode circuit are activated when the first and second control signals are activated, respectively, and deactivated when the first and second control signals are deactivated, respectively.

In some embodiments, the common-mode circuit includes first and second switches and first and second resistors. The first switch has first and second terminals and a control terminal. The first terminal of the first switch is configured to receive a supply voltage, the control terminal of the first switch is coupled with the controller, and configured to receive the second control signal, and the second terminal of the first switch is configured to output the supply voltage when the second control signal is activated. The first resistor has first and second terminals. The first terminal of the first resistor is coupled with the second terminal of the first switch, and configured to receive the supply voltage, and the second terminal of the first resistor is configured to generate the common-mode voltage. The second resistor has first and second terminals. The first terminal of the second resistor is coupled with the second terminal of the first resistor. The second switch has first and second terminals and a control terminal. The first terminal of the second switch is coupled with the second terminal of the second resistor, the second terminal of the second switch is coupled with ground, and the control terminal of the second switch is coupled with the control terminal of the first switch, and configured to receive the second control signal.

In some embodiments, the clock circuit includes third and fourth resistors coupled with each other in series such that a first terminal of the third resistor is coupled with a first terminal of the fourth resistor. The first terminals of the third and fourth resistors are further coupled with the second terminal of the first resistor, and configured to receive the common-mode voltage. A second terminal of the third resistor is coupled with the external oscillator, and configured to receive the first clock signal, and a second terminal of the fourth resistor is coupled with the external oscillator and the pull-down circuit, and configured to receive the second clock signal.

In some embodiments, the clock circuit includes a comparator that is coupled with the external oscillator, and configured to receive the first clock signal and a fourth clock signal, and compare the first clock signal and the fourth clock signal to generate a comparison signal. The comparison signal is activated when a voltage level of the first clock signal is greater than or equal to a voltage level of the fourth clock signal, and deactivated when the voltage level of the first clock signal is less than the voltage level of the fourth clock signal. The clock circuit further includes a schmitt trigger that is coupled with the external oscillator, and configured to receive the first clock signal, and generate a schmitt trigger output signal. The schmitt trigger output signal is activated when the voltage level of the first clock signal is greater than or equal to a threshold value, and deactivated when the voltage level of the first clock signal is less than the threshold value.

In some embodiments, the clock circuit further includes a multiplexer that has first and second input terminals, a select terminal, and an output terminal. The first input terminal of the multiplexer is coupled with the comparator, and configured to receive the comparison signal. The second input terminal of the multiplexer is coupled with the schmitt trigger, and configured to receive the schmitt trigger output signal. The select terminal of the multiplexer is coupled with the controller, and configured to receive a third control signal. The controller is further configured to generate the third control signal such that the third control signal is activated when the processing circuitry operates in the first mode, and deactivated when the processing circuitry operates in the second and third modes. The output terminal of the multiplexer is configured to output, based on the third control signal, one of the comparison signal and the schmitt trigger output signal as the third clock signal.

In some embodiments, the controller is further configured to generate fourth and fifth control signals such that the fourth control signal is deactivated when the processing circuitry operates in the first mode, and activated when the processing circuitry operates in the second and third modes, and the fifth control signal is activated when the processing circuitry operates in the first mode, and deactivated when the processing circuitry operates in the second and third modes. The comparator and the schmitt trigger are further coupled with the controller, and configured to receive the fourth and fifth control signals, respectively. The comparator and the schmitt trigger are activated when the fourth and fifth control signals are activated, respectively, and deactivated when the fourth and fifth control signals are deactivated, respectively.

In some embodiments, the clock circuit further includes third and fourth switches and first and second transistors. The third switch has first and second terminals and a control terminal. The first terminal of the third switch is configured to receive a supply voltage, the control terminal of the third switch is configured to receive a sixth control signal, and the second terminal of the third switch is configured to output the supply voltage when the sixth control signal is activated. The first transistor has source, gate, and drain terminals. The source terminal of the first transistor is coupled with the second terminal of the third switch, and configured to receive the supply voltage when the sixth control signal is activated, the gate terminal of the first transistor is configured to receive a bias voltage, and the drain terminal of the first transistor is coupled with the comparator, and configured to output the fourth clock signal. The second transistor has source, gate, and drain terminals. The drain terminal of the second transistor is coupled with the drain terminal of the first transistor, and the gate terminal of the second transistor is coupled with the external oscillator, and configured to receive the first clock signal. The fourth switch has first and second terminals and a control terminal. The first terminal of the fourth switch is coupled with the source terminal of the second transistor, the second terminal of the fourth switch is coupled with ground, and the control terminal of the fourth switch is configured to receive the sixth control signal.

In some embodiments, the controller is further configured to generate the sixth control signal such that the sixth control signal is deactivated when the processing circuitry operates in the first and second modes, and activated when the processing circuitry operates in the third mode.

In some embodiments, the controller is further coupled with the clock circuit, and further configured to generate a status signal based on the third clock signal. The status signal indicates whether the mode of operation of the external oscillator matches a mode of operation of the processing circuitry.

In some embodiments, to detect the mode of operation of the external oscillator, the controller is further configured to initialize the processing circuitry to operate in the first mode and receive the third clock signal outputted when the processing circuitry operates in the first mode. The controller is further configured to determine, based on the received third clock signal, whether the external oscillator is operating in the first mode. When the controller determines that the external oscillator is operating in the first mode, the status signal is activated to indicate that the processing circuitry is operating in a same mode as that of the external oscillator. When the controller determines that the external oscillator is not operating in the first mode, the controller is further configured to initialize the processing circuitry to operate in the second mode and receive the third clock signal outputted when the processing circuitry operates in the second mode. The controller is further configured to determine, based on the received third clock signal, whether the external oscillator is operating in the second mode. When the controller determines that the external oscillator is operating in the second mode, the status signal is activated to indicate that the processing circuitry is operating in a same mode as that of the external oscillator. When the controller determines that the external oscillator is not operating in the second mode, the controller is further configured to initialize the processing circuitry to operate in the third mode and receive the third clock signal outputted when the processing circuitry operates in the third mode. The controller is further configured to determine, based on the received third clock signal, whether the external oscillator is operating in the third mode. When the controller determines that the external oscillator is operating in the third mode, the status signal is activated to indicate that the processing circuitry is operating in a same mode as that of the external oscillator.

Various embodiments of the present disclosure disclose an enabling system for enabling an external oscillator. The enabling system includes a controller that is configured to detect a mode of operation of the external oscillator. The mode of operation includes one of single-ended, differential, and crystal modes. The enabling system further includes processing circuitry that is coupled with the controller, and configured to operate in the detected mode for enabling the external oscillator. The processing circuitry includes a clock circuit that is coupled with the external oscillator, a common-mode circuit that is coupled with the clock circuit, and a pull-down circuit that is coupled between the external oscillator and ground. The common-mode circuit is activated when the processing circuitry operates in the differential mode, and deactivated when the processing circuitry operates in the single-ended and crystal modes. When the common-mode circuit is activated, the common-mode circuit is configured to generate a common-mode voltage. The clock circuit is configured to receive at least one of first and second clock signals and the common-mode voltage, and output a third clock signal. Further, the pull-down circuit is activated when the processing circuitry operates in the single-ended mode, and deactivated when the processing circuitry operates in the differential and crystal modes. When the pull-down circuit is activated, the pull-down circuit is configured to receive and pull down the second clock signal to ground.

The enabling system of the present disclosure detects the mode of operation of the external oscillator by operating in the single-ended, differential, and crystal modes sequentially, and determining whether the current operating mode is same as the mode of operation of the external oscillator. The enabling system determines whether the current operating mode is same as the mode of operation of the external oscillator based on the third clock signal outputted during the corresponding mode. Thus, a need for including various pads in the enabling system to detect the mode of operation of the external oscillator is eliminated. As a result, a size and a manufacturing cost of the enabling system are significantly less than that of a conventional enabling system that utilizes one or more pads to detect the mode of operation of the external oscillator. Consequently, a size and a manufacturing cost of an SoC including the enabling system of the present disclosure are significantly less than that of an SoC including the conventional enabling system.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
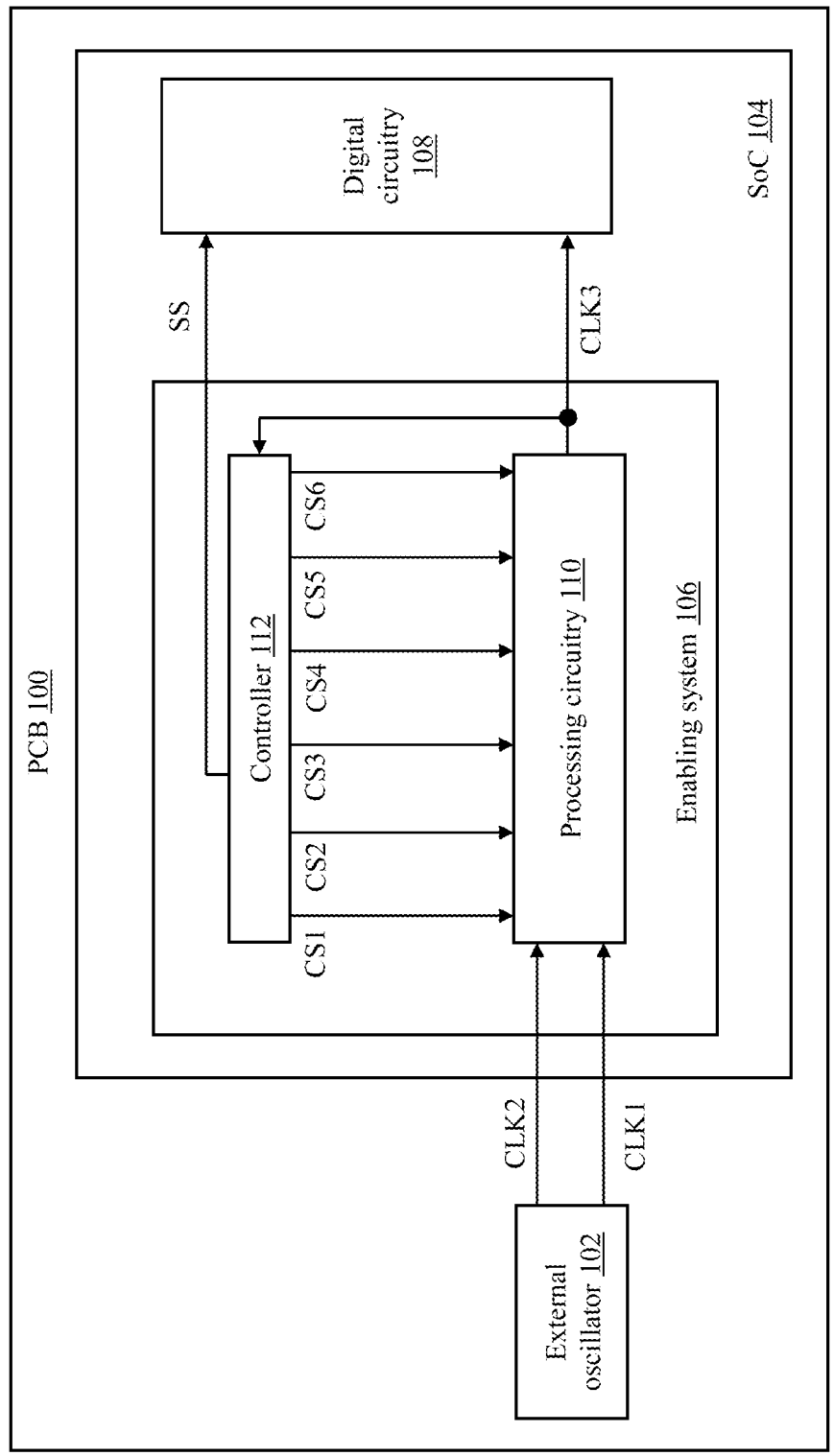
FIG. 1 illustrates a schematic block diagram of a printed circuit board (PCB) in accordance with an embodiment of the present disclosure.

FIG. 1 illustrates a schematic block diagram of a printed circuit board (PCB) 100 in accordance with an embodiment of the present disclosure. The PCB 100 is an electronic circuit board that includes an oscillator 102 and a system on chip (SoC) 104. The oscillator 102 is external to the SoC 104, and is hereinafter referred to as the "external oscillator 102". The PCB 100 may be included in various devices such as automotive devices, mobile devices, network devices, or the like.

The external oscillator 102 is configured to operate in one of first through third modes. The first through third modes correspond to single-ended, differential, and crystal modes, respectively. The external oscillator 102 is further configured to generate at least one of first and second clock signals CLK1 and CLK2. When the external oscillator 102 is operating in the differential mode, the first and second clock signals CLK1 and CLK2 are differential signals. When the external oscillator 102 is operating in the single-ended mode, the first clock signal CLK1 is a single-ended signal, and is generated at a first predetermined voltage level, and the second clock signal CLK2 corresponds to a reference signal. In an example, a voltage level of the second clock signal CLK2 is equal to a ground voltage. Further, when the external oscillator 102 is operating in the crystal mode, the first and second clock signals CLK1 and CLK2 are generated at second and third predetermined voltage levels, respectively. In an example, the first and second clock signals CLK1 and CLK2 generated at the second and third predetermined voltage levels, respectively, are complementary signals.

The SoC 104 is coupled with the external oscillator 102, and includes an enabling system 106 and digital circuitry 108. The enabling system 106 is coupled with the external oscillator 102, and configured to receive at least one of the first and second clock signals CLK1 and CLK2, and output a third clock signal CLK3. Based on the third clock signal CLK3, the enabling system 106 is further configured to generate a status signal SS. The enabling system 106 activates the status signal SS (i.e., generates the status signal SS at a logic high state) when the third clock signal CLK3 is stable (i.e., toggles between two constant voltage levels and has a constant frequency) after a predetermined time duration. Further, the enabling system 106 deactivates the status signal SS (i.e., generates the status signal SS at a logic low state) when the third clock signal CLK3 is unstable (i.e., toggles between three or more voltage levels and has a variable frequency) after the predetermined time duration.

The digital circuitry 108 is coupled with the enabling system 106, and configured to receive the third clock signal CLK3 and the status signal SS, and execute one or more synchronous operations associated therewith based on the third clock signal CLK3 and the status signal SS. In one embodiment, when the status signal SS is activated, the digital circuitry 108 executes the one or more synchronous operations based on the received third clock signal CLK3. Further, when the status signal SS is deactivated, the digital circuitry 108 discards the received third clock signal CLK3 (i.e., the received third clock signal CLK3 is not utilized by the digital circuitry 108). The digital circuitry 108 may include various components such as flip-flops, counters, or the like. Additionally, the digital circuitry 108 may correspond to a processor (not shown) of the SoC 104 that executes the one or more synchronous operations such as execution of read-only memory code based on the third clock signal CLK3.

To utilize the external oscillator 102 (i.e., at least one of the first and second clock signals CLK1 and CLK2 generated by the external oscillator 102) in the SoC 104, it is required to enable the external oscillator 102 in the SoC 104. In other words, to ensure that the third clock signal CLK3 utilized by the digital circuitry 108 for executing the one or more synchronous operations is stable after the predetermined time duration, it is required to enable the external oscillator 102 in the SoC 104. The enabling of the external oscillator 102 is facilitated by the enabling system 106. In other words, the enabling system 106 is configured to enable the external oscillator 102 that operates in one of the first through third modes. The enabling system 106 includes processing circuitry 110 and a controller 112. The controller 112 of the enabling system 106 is configured to detect a mode of operation of the external oscillator 102, and the processing circuitry 110 of the enabling system 106 is configured to operate in the detected mode for enabling the external oscillator 102. The mode of operation of the external oscillator 102 includes one of the first through third modes.

The processing circuitry 110 is coupled with controller 112, and configured to receive various control signals (such as first through sixth control signals CS1-CS6) from the controller 112, and configured to operate in the first through third modes sequentially based on the first through sixth control signals CS1-CS6. The processing circuitry 110 is further coupled with the external oscillator 102, and configured to receive at least one of the first and second clock signals CLK1 and CLK2. Based on the first through sixth control signals CS1-CS6 (i.e., the mode of operation of the processing circuitry 110) and at least one of the first and second clock signals CLK1 and CLK2, the processing circuitry 110 is further configured to output the third clock signal CLK3. The processing circuitry 110 is further configured to provide the third clock signal CLK3 to the controller 112. Further, the processing circuitry 110 is coupled with the digital circuitry 108, and configured to provide the third clock signal CLK3 to the digital circuitry 108. The structure and working of the processing circuitry 110 are explained in detail in conjunction with FIGS. 2-5.

The controller 112 is configured to generate and provide, to the processing circuitry 110, various control signals (such as the first through sixth control signals CS1-CS6) for controlling the processing circuitry 110 such that the processing circuitry 110 operates in the first through third modes sequentially. Further, the controller 112 is configured to receive the third clock signal CLK3 outputted by the processing circuitry 110 during each mode of operation of the processing circuitry 110, and generate the status signal SS based on the third clock signal CLK3. The status signal SS indicates whether the mode of operation of the external oscillator 102 matches the mode of operation of the processing circuitry 110 (i.e., whether the third clock signal CLK3 is stable after the predetermined time duration). The controller 112 activates the status signal SS when the mode of operation of the external oscillator 102 matches the mode of operation of the processing circuitry 110 (i.e., the third clock signal CLK3 is stable after the predetermined time duration). Further, the controller 112 deactivates the status signal SS when the mode of operation of the external oscillator 102 does not match the mode of operation of the processing circuitry 110 (i.e., the third clock signal CLK3 is unstable after the predetermined time duration). Thus, an activated state of the status signal SS indicates that the external oscillator 102 is enabled in the SoC 104. The controller 112 is further coupled with the digital circuitry 108, and configured to provide the status signal SS to the digital circuitry 108 to facilitate the execution of the one or more synchronous operations associated with the digital circuitry 108.

To detect the mode of operation of the external oscillator 102, the controller 112 is further configured to initialize the processing circuitry 110, by way of the first through sixth control signals CS1-CS6, to operate in each of the first through third modes sequentially, and receive the third clock signal CLK3 outputted during each mode of operation. Further, based on the third clock signal CLK3 outputted during each mode of operation of the processing circuitry 110, the controller 112 is further configured to determine whether the corresponding operating mode of the processing circuitry 110 matches the mode of operation of the external oscillator 102. For example, the controller 112 is further configured to initialize the processing circuitry 110, by way of the first through sixth control signals CS1-CS6, to operate in the first mode, and receive the third clock signal CLK3 outputted when the processing circuitry 110 operates in the first mode. Based on the received third clock signal CLK3, the controller 112 is further configured to determine whether the external oscillator 102 is operating in the first mode.

When the third clock signal CLK3 is stable after the predetermined time duration, the controller 112 determines that the external oscillator 102 is operating in the first mode. When the controller 112 determines that the external oscillator 102 is operating in the first mode, the status signal SS is activated to indicate that the processing circuitry 110 is operating in a same mode as that of the external oscillator 102. The external oscillator 102 is thus enabled in the SoC 104, and the digital circuitry 108 executes the one or more synchronous operations based on the third clock signal CLK3 received when the processing circuitry 110 operates in the first mode. When the third clock signal CLK3 is unstable after the predetermined time duration, the controller 112 determines that the external oscillator 102 is not operating in the first mode. When the controller 112 determines that the external oscillator 102 is not operating in the first mode, the status signal SS is deactivated to indicate that the processing circuitry 110 is not operating in a same mode as that of the external oscillator 102. In such a scenario, the digital circuitry 108 may discard the received third clock signal CLK3.

When the controller 112 determines that the external oscillator 102 is not operating in the first mode, the controller 112 is further configured to initialize, by way of the first through sixth control signals CS1-CS6, the processing circuitry 110 to operate in the second mode, and receive the third clock signal CLK3 outputted when the processing circuitry 110 operates in the second mode. Based on the received third clock signal CLK3, the controller 112 is further configured to determine whether the external oscillator 102 is operating in the second mode.

When the received third clock signal CLK3 is stable after the predetermined time duration, the controller 112 determines that the external oscillator 102 is operating in the second mode. When the controller 112 determines that the external oscillator 102 is operating in the second mode, the status signal SS is activated to indicate that the processing circuitry 110 is operating in a same mode as that of the external oscillator 102. The external oscillator 102 is thus enabled in the SoC 104, and the digital circuitry 108 executes the one or more synchronous operations based on the third clock signal CLK3 received when the processing circuitry 110 operates in the second mode. When the third clock signal CLK3 is unstable after the predetermined time duration, the controller 112 determines that the external oscillator 102 is not operating in the second mode. When the controller 112 determines that the external oscillator 102 is not operating in the second mode, the status signal SS is deactivated to indicate that the processing circuitry 110 is not operating in a same mode as that of the external oscillator 102. In such a scenario, the digital circuitry 108 may discard the received third clock signal CLK3.

When the controller 112 determines that the external oscillator 102 is not operating in the second mode, the controller 112 is further configured to initialize, by way of the first through sixth control signals CS1-CS6, the processing circuitry 110 to operate in the third mode, and receive the third clock signal CLK3 outputted when the processing circuitry 110 operates in the third mode. Based on the received third clock signal CLK3, the controller 112 is further configured to determine whether the external oscillator 102 is operating in the third mode.

When the received third clock signal CLK3 is stable after the predetermined time duration, the controller 112 determines that the external oscillator 102 is operating in the third mode. When the controller 112 determines that the external oscillator 102 is operating in the third mode, the status signal SS is activated to indicate that the processing circuitry 110 is operating in a same mode as that of the external oscillator 102. The external oscillator 102 is thus enabled in the SoC 104, and the digital circuitry 108 executes the one or more synchronous operations based on the third clock signal CLK3 received when the processing circuitry 110 operates in the third mode. When the third clock signal CLK3 is unstable after the predetermined time duration, the controller 112 determines that the external oscillator 102 is not operating in the third mode. When the controller 112 determines that the external oscillator 102 is not operating in the third mode, the status signal SS is deactivated to indicate that the processing circuitry 110 is not operating in a same mode as that of the external oscillator 102. In such a scenario, the digital circuitry 108 may discard the received third clock signal CLK3, and the external oscillator 102 may be disconnected from the SoC 104.

Figure 2:
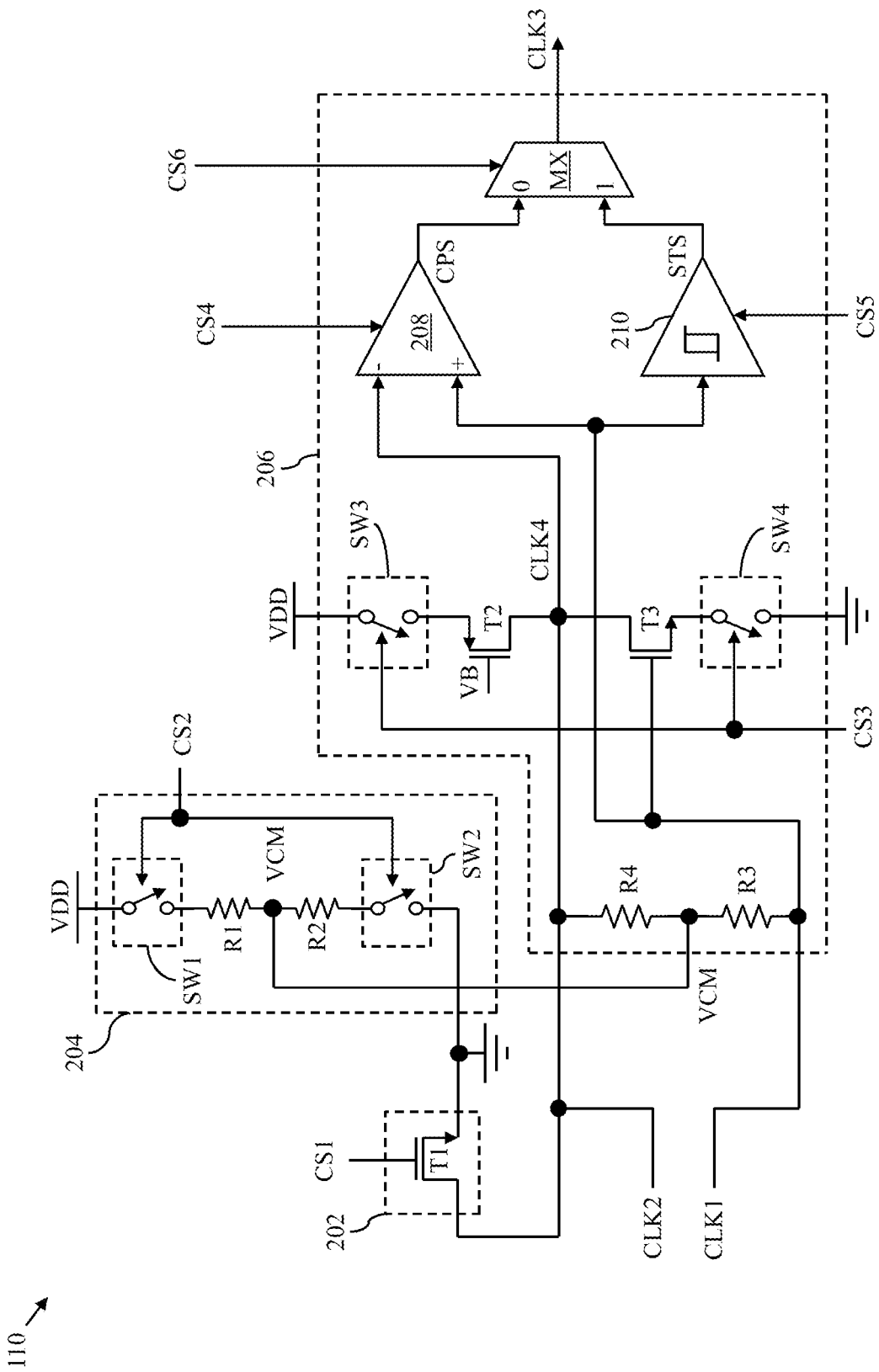
FIG. 2 illustrates a schematic circuit diagram of processing circuitry of the PCB of FIG. 1 in accordance with an embodiment of the present disclosure.

FIG. 2 illustrates a schematic circuit diagram of the processing circuitry 110 in accordance with an embodiment of the present disclosure. The processing circuitry 110 includes a pull-down circuit 202, a common-mode circuit 204, and a clock circuit 206.

The pull-down circuit 202 is coupled between the external oscillator 102 and ground. The pull-down circuit 202 is further coupled with the controller 112, and configured to receive the first control signal CS1. The first control signal CS1 is generated by the controller 112 such that the first control signal CS1 is activated (i.e., is at a logic high state) when the processing circuitry 110 operates in the first mode, and deactivated (i.e., is at a logic low state) when the processing circuitry 110 operates in the second and third modes. Further, when the first control signal CS1 is activated, the pull-down circuit 202 is activated (i.e., is operational), and when the first control signal CS1 is deactivated, the pull-down circuit 202 is deactivated (i.e., is non-operational). Thus, the pull-down circuit 202 is activated when the processing circuitry 110 operates in the first mode, and deactivated when the processing circuitry 110 operates in the second and third modes. When the pull-down circuit 202 is activated, the pull-down circuit 202 is further configured to receive and pull down the second clock signal CLK2 to ground.

In the presently preferred embodiment, the pull-down circuit 202 corresponds to a first transistor T1 having a source terminal that is coupled with ground, a gate terminal that is coupled with the controller 112, and configured to receive the first control signal CS1, and a drain terminal that is coupled with the external oscillator 102, and configured to receive the second clock signal CLK2. The first transistor T1 may be an n-channel metal oxide semiconductor (NMOS)

transistor. Thus, when the first control signal CS1 is activated, the first transistor T1 is activated, and the second clock signal CLK2 is pulled down to ground.

It will however be apparent to a person skilled in the art that the scope of the present disclosure is not limited to the first transistor T1 being utilized as the pull-down circuit 202. In various other embodiments, the pull-down circuit 202 may be implemented in a different manner, without deviating from the scope of the present disclosure. However, in each implementation of the pull-down circuit 202, when the pull-down circuit 202 is activated, the pull-down circuit 202 is configured to receive and pull down the second clock signal CLK2 to ground.

The common-mode circuit 204 is coupled with the controller 112, and configured to receive the second control signal CS2. The second control signal CS2 is generated by the controller 112 such that the second control signal CS2 is activated (i.e., is at a logic high state) when the processing circuitry 110 operates in the second mode, and deactivated (i.e., is at a logic low state) when the processing circuitry 110 operates in the first and third modes. Further, when the second control signal CS2 is activated, the common-mode circuit 204 is activated (i.e., is operational), and when the second control signal CS2 is deactivated, the common-mode circuit 204 is deactivated (i.e., is non-operational). Thus, the common-mode circuit 204 is activated when the processing circuitry 110 operates in the second mode, and deactivated when the processing circuitry 110 operates in the first and third modes. When the common-mode circuit 204 is operational, the common-mode circuit 204 is further configured to generate a common-mode voltage VCM. The common-mode circuit 204 includes first and second switches SW1 and SW2, and first and second resistors R1 and R2.

The first switch SW1 has first and second terminals and a control terminal. The first terminal of the first switch SW1 is coupled with a power supply (not shown), and configured to receive a supply voltage VDD, and the control terminal of the first switch SW1 is coupled with the controller 112, and configured to receive the second control signal CS2. When the second control signal CS2 is activated, the first switch SW1 is activated (i.e., is operational), and when the second control signal CS2 is deactivated, the first switch SW1 is deactivated (i.e., is non-operational). Further, when the second control signal CS2 is activated (i.e., when the first switch SW1 is operational), the second terminal of the first switch SW1 is configured to output the supply voltage VDD.

The first resistor R1 has first and second terminals. The first terminal of the first resistor R1 is coupled with the second terminal of the first switch SW1, and configured to receive the supply voltage VDD when the first switch SW1 is activated. The second terminal of the first resistor R1 is configured to generate the common-mode voltage VCM. The second resistor R2 has first and second terminals. The first terminal of the second resistor R2 is coupled with the second terminal of the first resistor R1.

The second switch SW2 has first and second terminals and a control terminal. The first terminal of the second switch SW2 is coupled with the second terminal of the second resistor R2, and the second terminal of the second switch SW2 is coupled with ground. The control terminal of the second switch SW2 is coupled with the control terminal of the first switch SW1 and the controller 112, and configured to receive the second control signal CS2. When the second control signal CS2 is activated, the second switch SW2 is activated (i.e., is operational), and when the second control signal CS2 is deactivated, the second switch SW2 is deactivated (i.e., is non-operational). Further, when the second control signal CS2 is activated (i.e., when the second switch SW2 is operational), the second terminal of the second resistor R2 is coupled with ground.

The first terminal of the first resistor R1 thus receives the supply voltage VDD and the second terminal of the second resistor R2 is coupled with ground when the processing circuitry 110 operates in the second mode (i.e., when the second control signal CS2 is activated). Hence, when the processing circuitry 110 operates in the second mode, the first and second resistors R1 and R2 form a voltage divider circuit, and the second terminal of the first resistor R1 generates the common-mode voltage VCM. Although FIG. 2 illustrates that the common-mode circuit 204 is included in the SoC 104, the scope of the present disclosure is not limited to it. In various other embodiments, the common-mode circuit 204 may be external to the SoC 104, without deviating from the scope of the present disclosure.

The clock circuit 206 is coupled with the external oscillator 102, and configured to receive at least one of the first and second clock signals CLK1 and CLK2. The clock circuit 206 is further coupled with the controller 112, and further configured to receive the third through sixth control signals CS3-CS6. Based on the third through sixth control signals CS3-CS6 and at least one of the first and second clock signals CLK1 and CLK2, the clock circuit 206 is further configured to output the third clock signal CLK3. Further, the clock circuit 206 is coupled with the common-mode circuit 204, and configured to receive the common-mode voltage VCM. In other words, the common-mode circuit 204 is further configured to provide the common-mode voltage VCM to the clock circuit 206. The third clock signal CLK3 is further outputted by the clock circuit 206 based on the common-mode voltage VCM. Further, the clock circuit 206 is coupled with the pull-down circuit 202 such that when the pull-down circuit 202 is activated, the second clock signal CLK2 received by the clock circuit 206 is pulled down to ground. Thus, the clock circuit 206 outputs the third clock signal CLK3 based on the activation of the pull-down circuit 202, the third through sixth control signals CS3-CS6, the common-mode voltage VCM, and at least one of the first and second clock signals CLK1 and CLK2.

The clock circuit 206 is further configured to provide the third clock signal CLK3 to the controller 112 to facilitate the generation of the status signal SS. Further, the clock circuit 206 is coupled with digital circuitry 108, and configured to provide the third clock signal CLK3 to the digital circuitry 108 to facilitate the execution of the one or more synchronous operations associated with the digital circuitry 108.

The clock circuit 206 includes third and fourth resistors R3 and R4, third and fourth switches SW3 and SW4, second and third transistors T2 and T3, a comparator 208, a schmitt trigger 210, and a multiplexer MX.

The third and fourth resistors R3 and R4 are coupled with each other in series such that a first terminal of the third resistor R3 is coupled with a first terminal of the fourth resistor R4. The first terminals of the third and fourth resistors R3 and R4 are further coupled with the second terminal of the first resistor R1, and configured to receive the common-mode voltage VCM. A second terminal of the third resistor R3 is coupled with the external oscillator 102, and configured to receive the first clock signal CLK1. Similarly, a second terminal of the fourth resistor R4 is coupled with the external oscillator 102 and the pull-down circuit 202, and configured to receive the second clock signal CLK2. Thus, when the pull-down circuit 202 is activated, the second terminal of the fourth resistor R4 is coupled with ground.

The third and fourth resistors R3 and R4 mitigate noise (i.e., irregularities) in the first and second clock signals CLK1 and CLK2.

The third switch SW3 has first and second terminals and a control terminal. The first terminal of the third switch SW3 is coupled with the power supply, and configured to receive the supply voltage VDD, and the control terminal of the third switch SW3 is coupled with the controller 112, and configured to receive the third control signal CS3. The third control signal CS3 is generated by the controller 112 such that the third control signal CS3 is deactivated (i.e., is at a logic low state) when the processing circuitry 110 operates in the first and second modes, and activated (i.e., is at a logic high state) when the processing circuitry 110 operates in the third mode. When the third control signal CS3 is activated, the third switch SW3 is activated (i.e., is operational), and when the third control signal CS3 is deactivated, the third switch SW3 is deactivated (i.e., is non-operational). Thus, the third switch SW3 is deactivated when the processing circuitry 110 operates in the first and second modes, and activated when the processing circuitry 110 operates in the third mode. Further, when the third control signal CS3 is activated (i.e., when the third switch SW3 is activated), the second terminal of the third switch SW3 is configured to output the supply voltage VDD.

The second transistor T2 has source, gate, and drain terminals. The source terminal of the second transistor T2 is coupled with the second terminal of the third switch SW3, and configured to receive the supply voltage VDD when the third switch SW3 is activated. The gate terminal of the second transistor T2 is coupled with a bias voltage generator (not shown), and configured to receive a bias voltage VB. Further, the drain terminal of the second transistor T2 is coupled with the external oscillator 102, the second terminal of the fourth resistor R4, and the pull-down circuit 202, and configured to output a fourth clock signal CLK4. In one embodiment, the second transistor T2 is a p-channel metal oxide semiconductor (PMOS) transistor.

The third transistor T3 has source, gate, and drain terminals. The drain terminal of the third transistor T3 is coupled with the drain terminal of the second transistor T2. The gate terminal of the third transistor T3 is coupled with the external oscillator 102 and the second terminal of the third resistor R3, and configured to receive the first clock signal CLK1. In an embodiment, the third transistor T3 is an NMOS transistor.

The fourth switch SW4 has first and second terminals and a control terminal. The first terminal of the fourth switch SW4 is coupled with the source terminal of the third transistor T3, and the second terminal of the fourth switch SW4 is coupled with ground. Further, the control terminal of the fourth switch SW4 is coupled with control terminal of the third switch SW3 and the controller 112, and configured to receive the third control signal CS3. When the third control signal CS3 is activated, the fourth switch SW4 is activated (i.e., is operational), and when the third control signal CS3 is deactivated, the fourth switch SW4 is deactivated (i.e., is non-operational). Thus, the fourth switch SW4 is deactivated when the processing circuitry 110 operates in the first and second modes, and activated when the processing circuitry 110 operates in the third mode. Further, when the third control signal CS3 is activated (i.e., when the fourth switch SW4 is activated), the drain terminal of the third transistor T3 is coupled with ground.

The source terminal of the second transistor T2 receives the supply voltage VDD and the source terminal of the third transistor T3 is coupled with ground when the processing circuitry 110 operates in the third mode (i.e., when the third control signal CS3 is activated). Hence, when the processing circuitry 110 operates in the third mode, the drain terminals of the second and third transistors T2 and T3 output the fourth clock signal CLK4 based on the bias voltage VB, the supply voltage VDD, and the first and second clock signals CLK1 and CLK2. In one example, a voltage level of the fourth clock signal CLK4 is equal to a sum of the voltage level of the second clock signal CLK2 and the supply voltage VDD. The combination of the second and third transistors T2 and T3 and the third and fourth switches SW3 and SW4 is referred to as a gain stage of the processing circuitry 110.

Although FIG. 2 illustrates the utilization of the second and third transistors T2 and T3 for outputting the fourth clock signal CLK4 when the processing circuitry 110 operates in the third mode, the scope of the present disclosure is not limited to it. In various other embodiments, for outputting the fourth clock signal CLK4, the clock circuit 206 may include various transistors that are coupled in parallel with the second transistor T2, and various transistors that are coupled in parallel with the third transistor T3, without deviating from the scope of the present disclosure. In such a scenario, activation and deactivation of such transistors may be controlled by the controller 112 in a similar manner as described above. Further, a number of transistors coupled in parallel to the second and third transistors T2 and T3 may be determined based on frequencies of the first and second clock signals CLK1 and CLK2.

The comparator 208 is coupled with the drain terminals of the second and third transistors T2 and T3, the external oscillator 102, and the second terminal of the third resistor R3. The comparator 208 is further coupled with the controller 112, and configured to receive the fourth control signal CS4. The fourth control signal CS4 is generated by the controller 112 such that the fourth control signal CS4 is deactivated (i.e., is at a logic low state) when the processing circuitry 110 operates in the first mode, and activated (i.e., is at a logic high state) when the processing circuitry 110 operates in the second and third modes. Further, when the fourth control signal CS4 is activated, the comparator 208 is activated (i.e., is operational), and when the fourth control signal CS4 is deactivated, the comparator 208 is deactivated (i.e., is non-operational). Thus, the comparator 208 is deactivated when the processing circuitry 110 operates in the first mode, and activated when the processing circuitry 110 operates in the second and third modes.

When the comparator 208 is operational, the comparator 208 is further configured to receive the first clock signal CLK1 from the external oscillator 102, and the fourth clock signal CLK4 from the drain terminals of the second and third transistors T2 and T3. Further, the comparator 208 is configured to compare the first clock signal CLK1 and the fourth clock signal CLK4 to generate a comparison signal CPS. The comparator 208 activates the comparison signal CPS (i.e., generates the comparison signal CPS at a logic high state) when the voltage level of the first clock signal CLK1 is greater than or equal to a voltage level of the fourth clock signal CLK4. Further, the comparator 208 deactivates the comparison signal CPS (i.e., generates the comparison signal CPS at a logic low state) when the voltage level of the first clock signal CLK1 is less than the voltage level of the fourth clock signal CLK4.

The schmitt trigger 210 is coupled with the external oscillator 102 and the second terminal of the third resistor R3. The schmitt trigger 210 is further coupled with the controller 112, and configured to receive the fifth control signal CS5. The fifth control signal CS5 is generated by the controller 112 such that the fifth control signal CS5 is activated (i.e., is at a logic high state) when the processing circuitry 110 operates in the first mode, and deactivated (i.e., is at a logic low state) when the processing circuitry 110 operates in the second and third modes. Further, when the fifth control signal CS5 is activated, the schmitt trigger 210 is activated (i.e., is operational), and when the fifth control signal CS5 is deactivated, the schmitt trigger 210 is deactivated (i.e., is non-operational). Thus, the schmitt trigger 210 is activated when the processing circuitry 110 operates in the first mode, and deactivated when the processing circuitry 110 operates in the second and third modes.

When the schmitt trigger 210 is operational, the schmitt trigger 210 is configured to receive the first clock signal CLK1, and generate a schmitt trigger output signal STS. The schmitt trigger 210 activates the schmitt trigger output signal STS (i.e., generates the schmitt trigger output signal STS at a logic high state) when the voltage level of the first clock signal CLK1 is greater than or equal to a threshold value (not shown). Further, the schmitt trigger 210 deactivates the schmitt trigger output signal STS (i.e., generates the schmitt trigger output signal STS at a logic low state) when the voltage level of the first clock signal CLK1 is less than the threshold value. In an embodiment, a voltage level of the schmitt trigger output signal STS is less than the voltage level of the first clock signal CLK1. For example, when the voltage level of the first clock signal CLK1 is 1.8 volts, the voltage level of the schmitt trigger output signal STS is 0.8 volts. In such a scenario, the threshold value is equal to 0.8 volts.

The multiplexer MX has a first input terminal that is coupled with the comparator 208, and configured to receive the comparison signal CPS. The multiplexer MX further has a second input terminal that is coupled with the schmitt trigger 210, and configured to receive the schmitt trigger output signal STS. Further, the multiplexer MX has a select terminal that is coupled with the controller 112, and configured to receive the sixth control signal CS6. The sixth control signal CS6 is generated by the controller 112 such that the sixth control signal CS6 is activated (i.e., is at a logic high state) when the processing circuitry 110 operates in the first mode, and deactivated (i.e., is at a logic low state) when the processing circuitry 110 operates in the second and third modes.

The multiplexer MX further has an output terminal that is configured to output, based on the sixth control signal CS6, one of the comparison signal CPS and the schmitt trigger output signal STS as the third clock signal CLK3. In an embodiment, when the sixth control signal CS6 is activated (i.e., when the processing circuitry 110 operates in the first mode), the output terminal of the multiplexer MX outputs the schmitt trigger output signal STS as the third clock signal CLK3. Further, when the sixth control signal CS6 is deactivated (i.e., when the processing circuitry 110 operates in the second and third modes), the output terminal of the multiplexer MX outputs the comparison signal CPS as the third clock signal CLK3. The output terminal of the multiplexer MX is coupled with the controller 112 and the digital circuitry 108, and configured to provide the outputted third clock signal CLK3 to the controller 112 and the digital circuitry 108.

Figure 3:
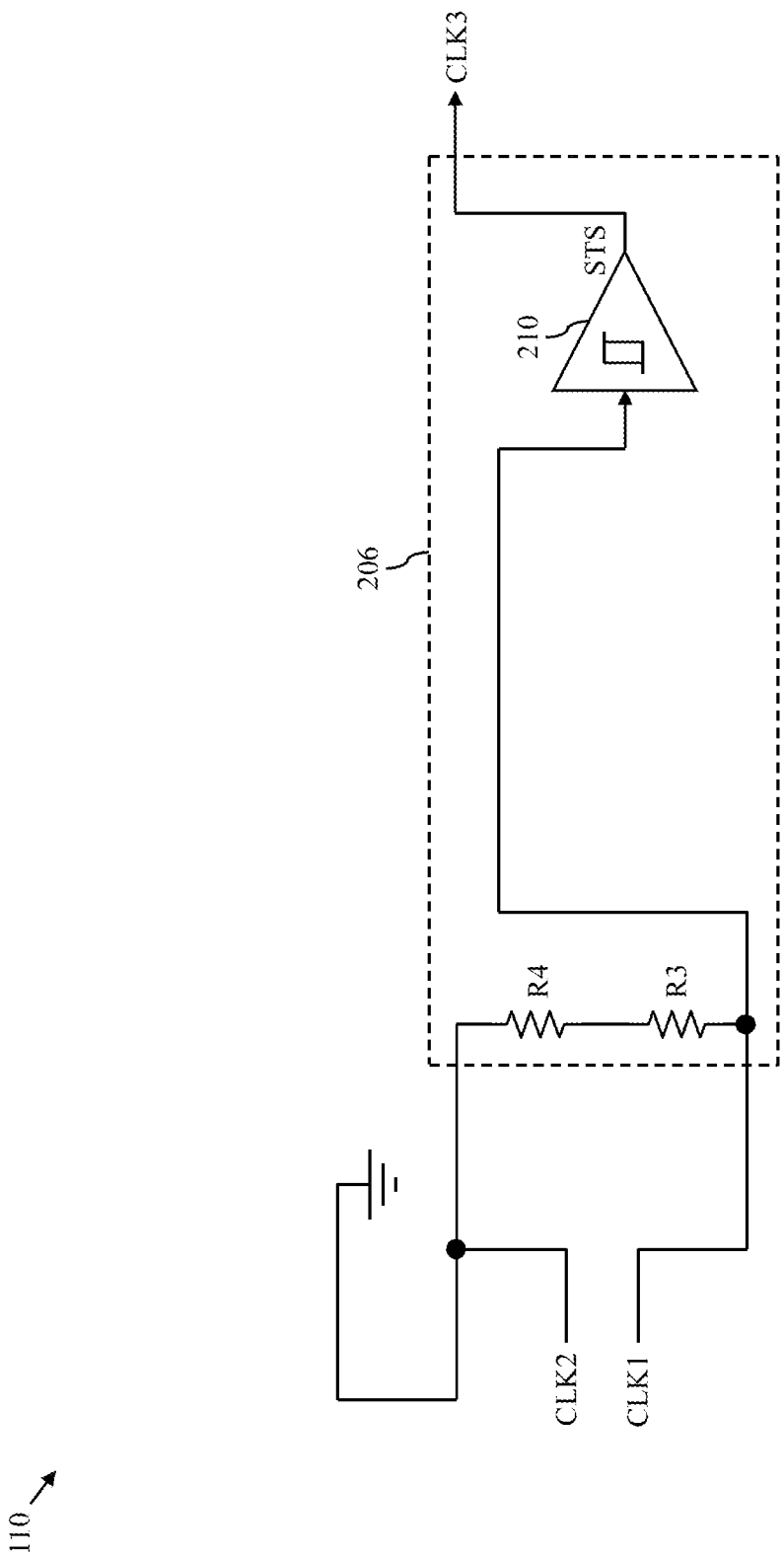
FIG. 3 illustrates a schematic circuit diagram of the processing circuitry operating in a first mode, i.e., a single-ended mode, in accordance with an embodiment of the present disclosure.

FIG. 3 illustrates a schematic circuit diagram of the processing circuitry 110 operating in the first mode, i.e., the single-ended mode, in accordance with an embodiment of the present disclosure. The processing circuitry 110 operates in the first mode to enable the external oscillator 102 that is operating in the first mode. As described above, when the external oscillator 102 operates in the first mode, the first clock signal CLK1 is at the first predetermined voltage level, and the voltage level of the second clock signal CLK2 is equal to a ground voltage.

When the processing circuitry 110 operates in the first mode, the first and fifth control signals CS1 and CS5 are activated, and the second through fourth control signals CS2-CS4 are deactivated. Thus, the pull-down circuit 202 and the schmitt trigger 210 are activated, and the common-mode circuit 204 (i.e., the first and second switches SW1 and SW2), the third and fourth switches SW3 and SW4, and the comparator 208 are deactivated.

As the pull-down circuit 202 is activated, the second clock signal CLK2 is pulled down to ground. The activation of the pull-down circuit 202 when the processing circuitry 110 operates in the first mode ensures that irrespective of the mode of operation of the external oscillator 102, the second clock signal CLK2 is pulled down to ground when the processing circuitry 110 operates in the first mode. Further, the gain stage of the processing circuitry 110 (i.e., the second and third transistors T2 and T3 and the third and fourth switches SW3 and SW4) is deactivated when the processing circuitry 110 operates in the first mode. As the comparator 208 is deactivated and the schmitt trigger 210 is activated, the schmitt trigger 210 receives the first clock signal CLK1, and outputs the schmitt trigger output signal STS based on the first clock signal CLK1.

When the processing circuitry 110 operates in the first mode, the sixth control signal CS6 is activated. Thus, the multiplexer MX (i.e., the output terminal of the multiplexer MX) outputs the schmitt trigger output signal STS as the third clock signal CLK3. The third clock signal CLK3 is then provided to the controller 112 and digital circuitry 108. The controller 112 generates the status signal SS based on the received third clock signal CLK3, and provides the status signal SS to the digital circuitry 108. Based on the third clock signal CLK3 and the status signal SS, the digital circuitry 108 executes the one or more synchronous operations associated therewith.

When the third clock signal CLK3 is stable after the predetermined time duration, the status signal SS is activated to indicate that the processing circuitry 110 is operating in a same mode as that of the external oscillator 102. The activated state of the status signal SS indicates to the digital circuitry 108 that the received third clock signal CLK3 is a stable clock signal, and hence may be utilized for executing the one or more synchronous operations. The utilization of the pull-down circuit 202 in the processing circuitry 110 when the processing circuitry 110 operates in the first mode ensures that if the external oscillator 102 is not operating in the first mode, the third clock signal CLK3 is unstable after the predetermined time duration. In such a scenario, the status signal SS is deactivated. The deactivated state of the status signal SS indicates to the digital circuitry 108 that the received third clock signal CLK3 is an unstable clock signal, and hence may not be utilized for executing the one or more synchronous operations. Thus, when the processing circuitry 110 operates in the first mode, the utilization of the pull-down circuit 202 in the processing circuitry 110 eliminates a possibility of inaccurately indicating to the digital circuitry 108 that the received third clock signal CLK3 is a stable clock signal.

Figure 4:
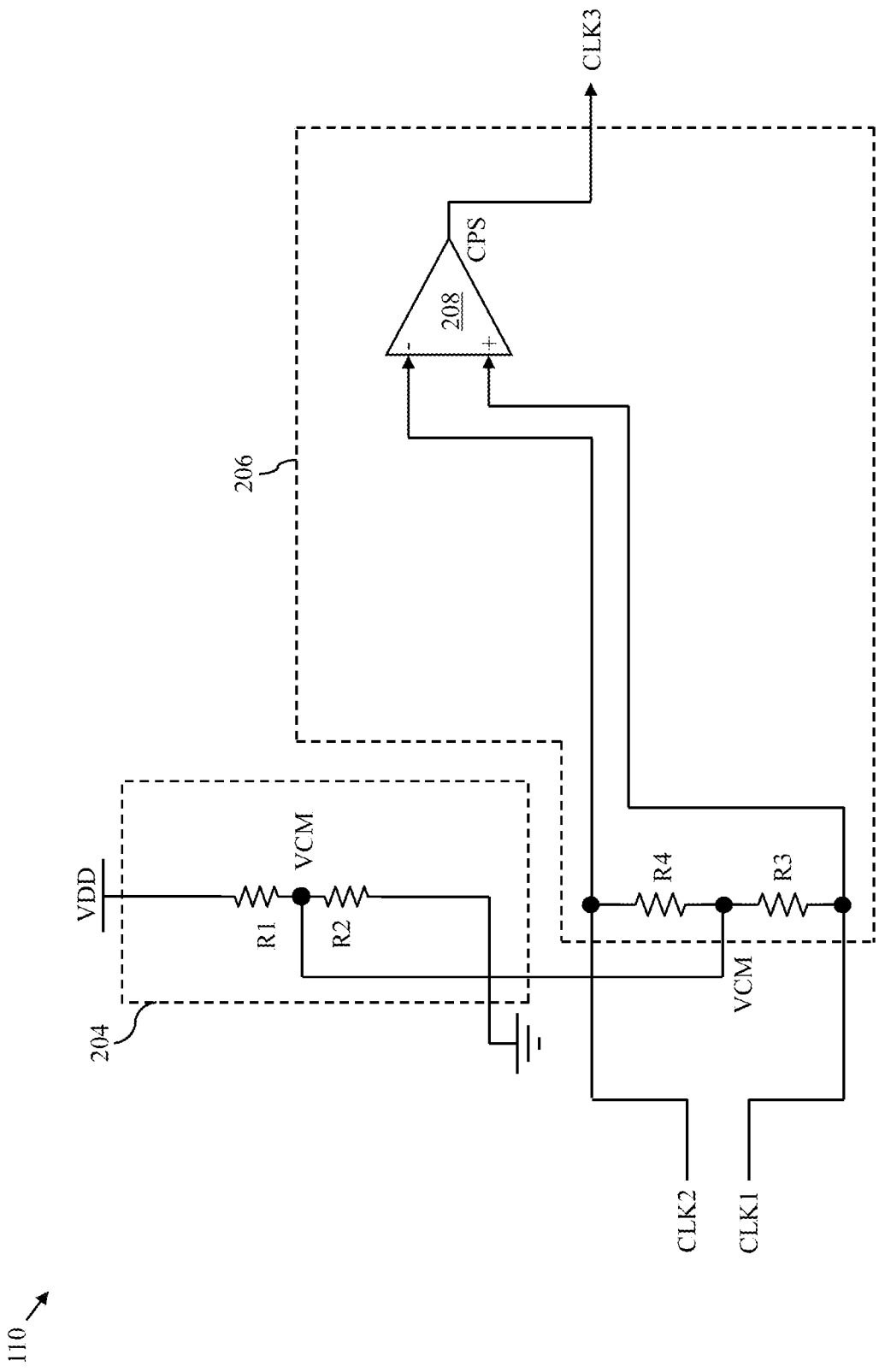
FIG. 4 illustrates a schematic circuit diagram of the processing circuitry operating in a second mode, i.e., a differential mode, in accordance with an embodiment of the present disclosure.

FIG. 4 illustrates a schematic circuit diagram of the processing circuitry 110 operating in the second mode, i.e., the differential mode, in accordance with an embodiment of the present disclosure. The processing circuitry 110 operates in the second mode to enable the external oscillator 102 that is operating in the second mode. As described above, when the external oscillator 102 operates in the second mode, the first and second clock signals CLK1 and CLK2 are differential signals.

When the processing circuitry 110 operates in the second mode, the second and fourth control signals CS2 and CS4 are activated, and the first, third, and fifth control signals CS1, CS3, and CS5 are deactivated. Thus, the common-mode circuit 204 (i.e., the first and second switches SW1 and SW2) and the comparator 208 are activated, and the pull-down circuit 202, the third and fourth switches SW3 and SW4, and the schmitt trigger 210 are deactivated.

As the common-mode circuit 204 is activated, the common-mode voltage VCM is provided to the clock circuit 206. The common-mode voltage VCM is added to the first and second clock signals CLK1 and CLK2 to ensure that the resultant voltage levels of the first and second clock signals CLK1 and CLK2 are greater than first and second desired values, respectively. The first and second desired values correspond to voltage levels that are required for an accurate operation of the comparator 208. The utilization of the common-mode circuit 204 when the processing circuitry 110 operates in the second mode eliminates a need for the gain stage of the processing circuitry 110 (i.e., the second and third transistors T2 and T3 and the third and fourth switches SW3 and SW4) to generate a common-mode voltage (such as the common-mode voltage VCM). Thus, the gain stage of the processing circuitry 110 is deactivated when the processing circuitry 110 operates in the second mode. Further, as the third and fourth switches SW3 and SW4 are deactivated, the voltage level of the fourth clock signal CLK4 is equal to the voltage level of the second clock signal CLK2. In other words, the comparator 208 receives the first and second clock signals CLK1 and CLK2. The comparator 208 compares the received first and second clock signals CLK1 and CLK2 to generate the comparison signal CPS.

When the processing circuitry 110 operates in the second mode, the sixth control signal CS6 is deactivated. Thus, the multiplexer MX (i.e., the output terminal of the multiplexer MX) outputs the comparison signal CPS as the third clock signal CLK3. The third clock signal CLK3 is then provided to the controller 112 and digital circuitry 108. The controller 112 generates the status signal SS based on the received third clock signal CLK3, and provides the status signal SS to the digital circuitry 108. Based on the third clock signal CLK3 and the status signal SS, the digital circuitry 108 executes the one or more synchronous operations associated therewith.

When the third clock signal CLK3 is stable after the predetermined time duration, the status signal SS is activated to indicate that the processing circuitry 110 is operating in a same mode as that of the external oscillator 102. The activated state of the status signal SS indicates to the digital circuitry 108 that the received third clock signal CLK3 is a stable clock signal, and hence may be utilized for executing the one or more synchronous operations. The utilization of the common-mode circuit 204 in the processing circuitry 110 when the processing circuitry 110 operates in the second mode ensures that if the external oscillator 102 is not operating in the second mode and is instead operating in the third mode, the outputted third clock signal CLK3 is unstable after the predetermined time duration. In such a scenario, the status signal SS is deactivated. The deactivated state of the status signal SS indicates to the digital circuitry 108 that the received third clock signal CLK3 is an unstable clock signal, and hence may not be utilized for executing the one or more synchronous operations. Thus, when the processing circuitry 110 operates in the second mode and the external oscillator 102 is operating in the third mode, the utilization of the common-mode circuit 204 in the processing circuitry 110 eliminates a possibility of inaccurately indicating to the digital circuitry 108 that the received third clock signal CLK3 is a stable clock signal.

Figure 5:
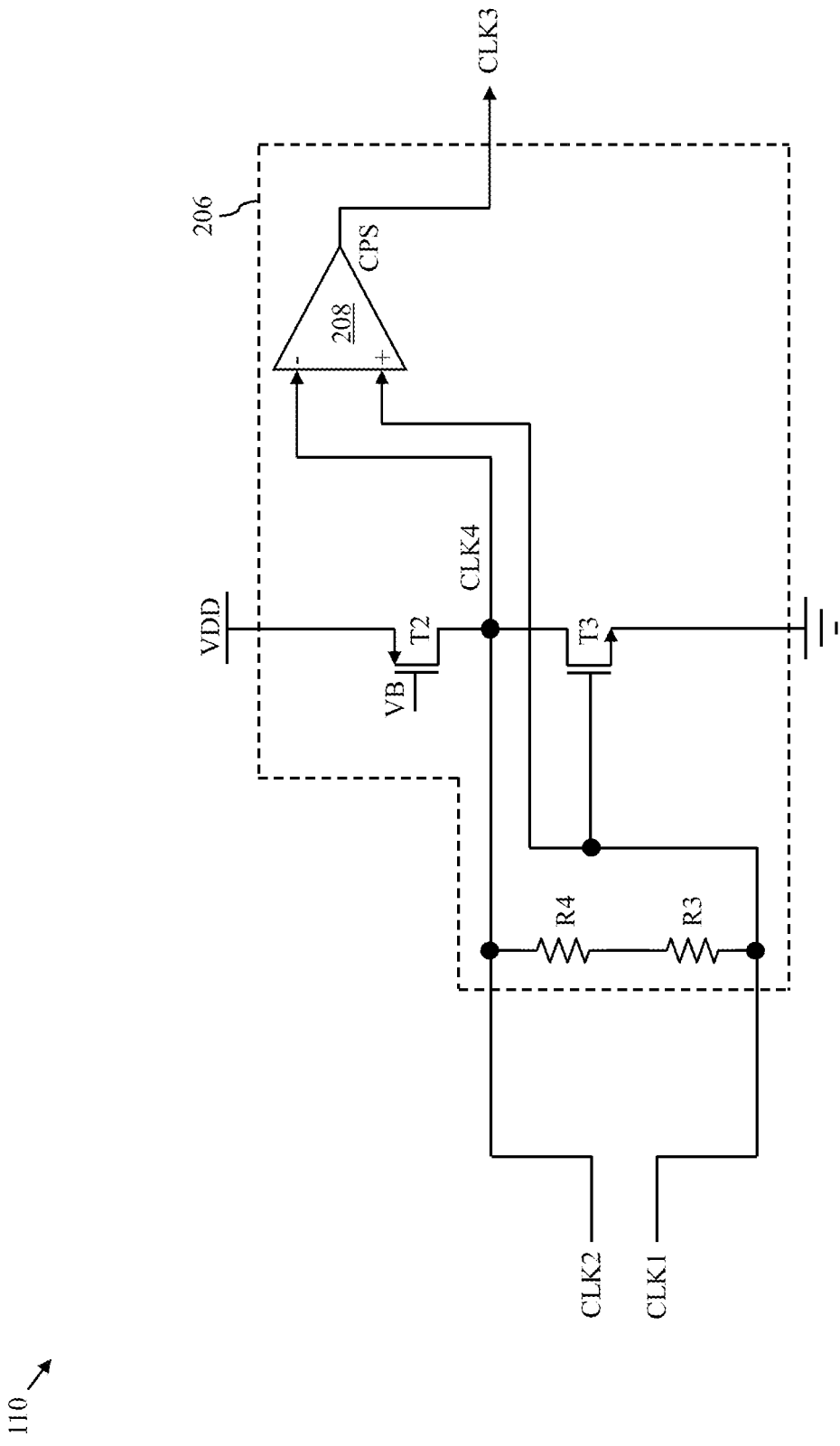
FIG. 5 illustrates a schematic circuit diagram of the processing circuitry operating in a third mode, i.e., a crystal mode, in accordance with an embodiment of the present disclosure.

FIG. 5 illustrates a schematic circuit diagram of the processing circuitry 110 operating in the third mode, i.e., the crystal mode, in accordance with an embodiment of the present disclosure. The processing circuitry 110 operates in the third mode to enable the external oscillator 102 that is operating in the third mode. As described above, when the external oscillator 102 operates in the third mode, the first and second clock signals CLK1 and CLK2 are generated at the second and third predetermined voltage levels, respectively, and may be complementary signals.

When the processing circuitry 110 operates in the third mode, the third and fourth control signals CS3 and CS4 are activated, and the first, second, and fifth control signals CS1, CS2, and CS5 are deactivated. Thus, the third and fourth switches SW3 and SW4 and the comparator 208 are activated, and the pull-down circuit 202, the common-mode circuit 204 (i.e., the first and second switches SW1 and SW2), and the schmitt trigger 210 are deactivated.

The second and third predetermined voltage levels are less than third and fourth desired values, respectively. The third and fourth desired values correspond to voltage levels that are required for ensuring that the voltage level of the third clock signal CLK3 is greater than a fifth desired value. Hence, the third and fourth switches SW3 and SW4 are activated (i.e., the gain stage of the processing circuitry 110 is activated) to amplify the second clock signal CLK2 by way of the second and third transistors T2 and T3, and output the fourth clock signal CLK4. The amplification provided by the second and third transistors T2 and T3 is controlled by way of the bias voltage VB and the first clock signal CLK1, respectively. Further, as the comparator 208 is activated and the schmitt trigger 210 is deactivated, the comparator 208 receives the first and fourth clock signals CLK1 and CLK4, and compares the first and fourth clock signals CLK1 and CLK4 to generate the comparison signal CPS.

When the processing circuitry 110 operates in the third mode, the sixth control signal CS6 is deactivated. Thus, the multiplexer MX (i.e., the output terminal of the multiplexer MX) outputs the comparison signal CPS as the third clock signal CLK3. The third clock signal CLK3 is then provided to the controller 112 and digital circuitry 108. The controller 112 generates the status signal SS based on the received third clock signal CLK3, and provides the status signal SS to the digital circuitry 108. Based on the third clock signal CLK3 and the status signal SS, the digital circuitry 108 executes the one or more synchronous operations associated therewith.

When the third clock signal CLK3 is stable after the predetermined time duration, the status signal SS is activated to indicate that the processing circuitry 110 is operating in a same mode as that of the external oscillator 102. The activated state of the status signal SS indicates to the digital circuitry 108 that the received third clock signal CLK3 is a stable clock signal, and hence may be utilized for executing the one or more synchronous operations. When the third clock signal CLK3 is unstable after the predetermined time duration, the status signal SS is deactivated. The deactivated state of the status signal SS indicates to the digital circuitry 108 that the received third clock signal CLK3 is an unstable clock signal, and hence may not be utilized for executing the one or more synchronous operations.

In operation, when the SoC 104 is powered up, it is required to enable the external oscillator 102 in the SoC 104 prior to utilizing at least one of the first and second clock signals CLK1 and CLK2 generated by the external oscillator 102 in the SoC 104. The SoC 104 includes the enabling system 106 for enabling the external oscillator 102. Enabling an oscillator that is external to the SoC 104 (such as the external oscillator 102) corresponds to operating in a mode that is same as the mode of operation of the external oscillator 102. The external oscillator 102 operates in one of the first through third modes. Thus, to enable the external oscillator 102, the controller 112 of the enabling system 106 detects the mode of operation of the external oscillator 102, and the processing circuitry 110 of the enabling system 106 operates in the detected mode.

The structure of the processing circuitry 110 enables the controller 112 to detect the mode of operation of the external oscillator 102 by initializing the processing circuitry 110 to operate in the first through third modes sequentially. For example, to detect the mode of operation of the external oscillator 102, the controller 112 firstly initializes the processing circuitry 110 to operate in the first mode, and receives the third clock signal CLK3 outputted when the processing circuitry 110 operates in the first mode. Based on the received third clock signal CLK3, the controller 112 determines whether the external oscillator 102 is operating in the first mode. When the controller 112 determines that the external oscillator 102 is operating in the first mode (i.e., when the received third clock signal CLK3 is stable after the predetermined time duration), the status signal SS is activated. The activated state of the status signal SS indicates to the digital circuitry 108 that the received third clock signal CLK3 is a stable clock signal, and hence may be utilized for executing the one or more synchronous operations. Thus, the mode of operation of the external oscillator 102 is detected, and the processing circuitry 110 operates in the detected mode to enable the external oscillator 102 in the SoC 104.

When the controller 112 determines that the external oscillator 102 is not operating in the first mode (i.e., when the received third clock signal CLK3 is unstable after the predetermined time duration), the status signal SS is deactivated to indicate that the processing circuitry 110 is not operating in a same mode as that of the external oscillator 102. The deactivated state of the status signal SS indicates to the digital circuitry 108 that the received third clock signal CLK3 is an unstable clock signal, and hence may not be utilized for executing the one or more synchronous operations. In such a scenario, the digital circuitry 108 may discard the received third clock signal CLK3.

The utilization of the pull-down circuit 202 in the processing circuitry 110 eliminates the possibility of inaccurately indicating that the third clock signal CLK3 is a stable clock signal. Thus, when the controller 112 determines that the third clock signal CLK3 is unstable after the predetermined time duration, it is apparent that the external oscillator 102 is operating in the second mode or the third mode. In such a scenario, the controller 112 further initializes the processing circuitry 110 to operate in the second mode, and receives the third clock signal CLK3 outputted when the processing circuitry 110 operates in the second mode. Based on the received third clock signal CLK3, the controller 112 determines whether the external oscillator 102 is operating in the second mode.

The utilization of the common-mode circuit 204 in the processing circuitry 110 ensures that when the processing circuitry 110 is operating in the second mode and the external oscillator 102 is operating in the third mode, the third clock signal CLK3 is unstable for the predetermined duration. Thus, when the third clock signal CLK3 is stable after the predetermined time duration, it is apparent that the operating mode is the first mode or the second mode. However, as the processing circuitry 110 is initialized to operate in the second mode exclusively after the determination that the external oscillator 102 is not operating in the first mode, it is apparent that the external oscillator 102 is operating in the second mode. When the controller 112 determines that the external oscillator 102 is operating in the second mode, the status signal SS is activated. The activated state of the status signal SS indicates to the digital circuitry 108 that the received third clock signal CLK3 is a stable clock signal, and hence may be utilized for executing the one or more synchronous operations. Thus, the mode of operation of the external oscillator 102 is detected, and the processing circuitry 110 operates in the detected mode to enable the external oscillator 102 in the SoC 104.

When the third clock signal CLK3 is unstable for the predetermined duration, the controller 112 determines that the external oscillator 102 is not operating in the second mode. In such a scenario, the status signal SS is deactivated to indicate that the processing circuitry 110 is not operating in a same mode as that of the external oscillator 102. The deactivated state of the status signal SS indicates to the digital circuitry 108 that the received third clock signal CLK3 is an unstable clock signal, and hence may not be utilized for executing the one or more synchronous operations. In such a scenario, the digital circuitry 108 may discard the received third clock signal CLK3.

When the controller 112 determines that the external oscillator 102 is not operating in the second mode, it is apparent that the external oscillator 102 may be operating in the third mode. In such a scenario, the controller 112 further initializes the processing circuitry 110 to operate in the third mode, and receives the third clock signal CLK3 outputted when the processing circuitry 110 operates in the third mode. Based on the received third clock signal CLK3, the controller 112 determines whether the external oscillator 102 is operating in the third mode. When the controller 112 determines that the external oscillator 102 is operating in the third mode (i.e., when the third clock signal CLK3 is stable after the predetermined time duration), the status signal SS is activated. The activated state of the status signal SS indicates to the digital circuitry 108 that the received third clock signal CLK3 is a stable clock signal, and hence may be utilized for executing the one or more synchronous operations. Thus, the mode of operation of the external oscillator 102 is detected, and the processing circuitry 110 operates in the detected mode to enable the external oscillator 102 in the SoC 104.

When the controller 112 determines that the external oscillator 102 is not operating in the third mode (i.e., when the third clock signal CLK3 is stable after the predetermined time duration), the status signal SS is deactivated to indicate that the processing circuitry 110 is not operating in a same mode as that of the external oscillator 102. The deactivated state of the status signal SS indicates to the digital circuitry 108 that the received third clock signal CLK3 is an unstable clock signal, and hence may not be utilized for executing the one or more synchronous operations. In such a scenario, the digital circuitry 108 may discard the received third clock signal CLK3, and the external oscillator 102 may be disconnected from the SoC 104.

Thus, the enabling system 106 of the present disclosure detects the mode of operation of the external oscillator 102 by operating in the first through third modes sequentially, and determining whether the current operating mode is same as the mode of operation of the external oscillator 102 based on the corresponding third clock signal CLK3. Thus, a need for including various pads in the enabling system 106 to detect the mode of operation of the external oscillator 102 is eliminated. As a result, a size and a manufacturing cost of the enabling system 106 are significantly less than that of a conventional enabling system that utilizes one or more pads to detect the mode of operation of the external oscillator 102. Consequently, a size and a manufacturing cost of the SoC 104 of the present disclosure are significantly less than that of an SoC including the conventional enabling system. The reduction in the size and the manufacturing cost of the SoC 104 results in the reduction in a size and a manufacturing cost of the PCB 100, respectively. Thus, the size and the manufacturing cost of the PCB 100 of the present disclosure are significantly less than that of a PCB including the conventional enabling system.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. An enabling system for enabling an external oscillator, the enabling system comprising:
   a controller that is configured to detect a mode of operation of the external oscillator, wherein the mode of operation includes one of first through third modes, and wherein the first through third modes correspond to single-ended, differential, and crystal modes, respectively; and
   processing circuitry that is coupled with the controller, and configured to operate in the detected mode for enabling the external oscillator, the processing circuitry comprising:
      a clock circuit that is coupled with the external oscillator, and configured to receive at least one of first and second clock signals, and output a third clock signal;
      a pull-down circuit that is coupled between the external oscillator and ground, and configured to receive and pull down the second clock signal to ground, wherein the pull-down circuit is activated when the processing circuitry operates in the first mode, and deactivated when the processing circuitry operates in the second and third modes; and
      a common-mode circuit that is coupled with the clock circuit, and configured to generate and provide a common-mode voltage to the clock circuit, wherein the third clock signal is further outputted by the clock circuit based on the common-mode voltage, and wherein the common-mode circuit is activated when the processing circuitry operates in the second mode, and deactivated when the processing circuitry operates in the first and third modes.

2. The enabling system of claim 1, wherein the controller is further configured to generate first and second control signals such that the first control signal is activated when the processing circuitry operates in the first mode, and deactivated when the processing circuitry operates in the second and third modes, and the second control signal is activated when the processing circuitry operates in the second mode, and deactivated when the processing circuitry operates in the first and third modes, wherein the pull-down circuit and the common-mode circuit are further coupled with the controller, and further configured to receive the first and second control signals, respectively, and wherein the pull-down circuit and the common-mode circuit are activated when the first and second control signals are activated, respectively, and deactivated when the first and second control signals are deactivated, respectively.

3. The enabling system of claim 2, wherein the common-mode circuit includes:
   a first switch having first and second terminals and a control terminal, wherein (i) the first terminal of the first switch is configured to receive a supply voltage, (ii) the control terminal of the first switch is coupled with the controller, and configured to receive the second control signal, and (iii) the second terminal of the first switch is configured to output the supply voltage when the second control signal is activated;
   a first resistor having first and second terminals, wherein (i) the first terminal of the first resistor is coupled with the second terminal of the first switch, and configured to receive the supply voltage when the second control signal is activated, and (ii) the second terminal of the first resistor is configured to generate the common-mode voltage;
   a second resistor having first and second terminals, wherein the first terminal of the second resistor is coupled with the second terminal of the first resistor; and
   a second switch having first and second terminals and a control terminal, wherein (i) the first terminal of the second switch is coupled with the second terminal of the second resistor, (ii) the second terminal of the second switch is coupled with ground, and (iii) the control terminal of the second switch is coupled with the control terminal of the first switch, and configured to receive the second control signal.

4. The enabling system of claim 3, wherein the clock circuit includes third and fourth resistors coupled with each other in series such that a first terminal of the third resistor is coupled with a first terminal of the fourth resistor, wherein the first terminals of the third and fourth resistors are fluffier coupled with the second terminal of the first resistor, and configured to receive the common-mode voltage, and wherein a second terminal of the third resistor is coupled with the external oscillator, and configured to receive the first clock signal, and a second terminal of the fourth resistor is coupled with the external oscillator and the pull-down circuit, and configured to receive the second clock signal.

5. The enabling system of claim 1, wherein the clock circuit includes:
   a comparator that is coupled with the external oscillator, and configured to receive the first clock signal and a fourth clock signal, and compare the first clock signal and the fourth clock signal to generate a comparison signal, wherein the comparison signal is activated when a voltage level of the first clock signal is greater than or equal to a voltage level of the fourth clock signal, and deactivated when the voltage level of the first clock signal is less than the voltage level of the fourth clock signal; and a schmitt trigger that is coupled with the external oscillator, and configured to receive the first clock signal, and generate a schmitt trigger output signal, wherein the schmitt trigger output signal is activated when the voltage level of the first clock signal is greater than or equal to a threshold value, and deactivated when the voltage level of the first clock signal is less than the threshold value.

6. The enabling system of claim 5, wherein the clock circuit further includes a multiplexer that has:

a first input terminal coupled with the comparator, and configured to receive the comparison signal;

a second input terminal coupled with the schmitt trigger, and configured to receive the schmitt trigger output signal;

a select terminal coupled with the controller, and configured to receive a third control signal, wherein the controller is further confiaured to generate the third control signal such that the third control signal is activated when the processing circuitry operates in the first mode, and deactivated when the processing circuitry operates in the second and third modes; and an output terminal configured to output, based on the third control signal, one of the comparison signal and the schmitt trigger output signal as the third clock signal.

7. The enabling system of claim 5, wherein the controller is further configured to generate fourth and fifth control signals such that the fourth control signal is deactivated when the processing circuitry operates in the first mode, and activated when the processing circuitry operates in the second and third modes, and the fifth control signal is activated when the processing circuitry operates in the first mode, and deactivated when the processing circuitry operates in the second and third modes, wherein the comparator and the schmitt trigger are further coupled with the controller, and configured to receive the fourth and fifth control signals, respectively, and wherein the comparator and the schmitt trigger are activated when the fourth and fifth control signals are activated, respectively, and deactivated when the fourth and fifth control signals are deactivated, respectively.

8. The enabling system of claim 5, wherein the clock circuit further includes:

a third switch having first and second terminals and a control terminal, wherein (i) the first terminal of the third switch is configured to receive a supply voltage, (ii) the control terminal of the third switch is configured to receive a sixth control signal, and (iii) the second terminal of the third switch is configured to output the supply voltage when the sixth control signal is activated;

a first transistor having source, gate, and drain terminals, wherein (i) the source terminal of the first transistor is coupled with the second terminal of the third switch, and configured to receive the supply voltage when the sixth control signal is activated, (ii) the gate terminal of the first transistor is configured to receive a bias voltage, and (iii) the drain terminal of the first transistor is coupled with the comparator, and configured to output the fourth clock signal;

a second transistor having source, gate, and drain terminals, wherein (i) the drain terminal of the second transistor is coupled with the drain terminal of the first transistor, and (ii) the gate terminal of the second transistor is coupled with the external oscillator, and configured to receive the first clock signal; and a fourth switch having first and second terminals and a control terminal, wherein (i) the first terminal of the fourth switch is coupled with the source terminal of the second transistor, (ii) the second terminal of the fourth switch is coupled with ground, and (iii) the control terminal of the fourth switch is configured to receive the sixth control signal.

9. The enabling system of claim 8, wherein the controller is further configured to generate the sixth control signal such that the sixth control signal is deactivated when the processing circuitry operates in the first and second modes, and activated when the processing circuitry operates in the third mode.

10. The enabling system of claim 1, wherein the controller is further coupled with the clock circuit, and further configured to generate a status signal based on the third clock signal, and wherein the status signal indicates whether the mode of operation of the external oscillator matches a mode of operation of the processing circuitry.

11. The enabling system of claim 10, wherein to detect the mode of operation of the external oscillator, the controller is further configured to:

initialize the processing circuitry to operate in the first mode;

receive the third clock signal outputted when the processing circuitry operates in the first mode; and determine, based on the received third clock signal, whether the external oscillator is operating in the first mode, wherein when the controller determines that the external oscillator is operating in the first mode, the status signal is activated to indicate that the processing circuitry is operating in a same mode as that of the external oscillator.

12. The enabling system of claim 11, wherein to detect the mode of operation of the external oscillator, the controller is further configured to:

initialize the processing circuitry to operate in the second mode when the controller determines that the external oscillator is not operating in the first mode;

receive the third clock signal outputted when the processing circuitry operates in the second mode; and determine, based on the received third clock signal, whether the external oscillator is operating in the second mode, wherein when the controller determines that the external oscillator is operating in the second mode, the status signal is activated to indicate that the processing circuitry is operating in a same mode as that of the external oscillator.

13. The enabling system of claim 12, wherein to detect the mode of operation of the external oscillator, the controller is further configured to:

initialize the processing circuitry to operate in the third mode when the controller determines that the external oscillator is not operating in the second mode;

receive the third clock signal outputted when the processing circuitry operates in the third mode; and determine, based on the received third clock signal, whether the external oscillator is operating in the third mode, wherein when the controller determines that the external oscillator is operating in the third mode, the status signal is activated to indicate that the processing circuitry is operating in a same mode as that of the external oscillator.

14. A system-on-chip (SoC), comprising:
an enabling system that is configured to enable an external oscillator that operates in one of first through third modes, wherein the first through third modes correspond to single-ended, differential, and crystal modes, respectively, the enabling system comprising:
  a controller that is configured to detect a mode of operation of the external oscillator; and
  processing circuitry that is coupled with the controller, and configured to operate in the detected mode for enabling the external oscillator, the processing circuitry comprising:
    a clock circuit that is coupled with the external oscillator, and configured to receive at least one of first and second clock signals, and output a third clock signal;
    a pull-down circuit that is coupled between the external oscillator and ground, and configured to receive and pull down the second clock signal to ground, wherein the pull-down circuit is activated when the processing circuitry operates in the first mode, and deactivated when the processing circuitry operates in the second and third modes; and
    a common-mode circuit that is coupled with the clock circuit, and configured to generate and provide a common-mode voltage to the clock circuit, wherein the third clock signal is further outputted by the clock circuit based on the common-mode voltage, and wherein the common-mode circuit is activated when the processing circuitry operates in the second mode, and deactivated when the processing circuitry operates in the first and third modes; and
  digital circuitry that is coupled with the clock circuit of the enabling system, and configured to receive the third clock signal, and execute one or more synchronous operations associated therewith.

15. The SoC of claim 14, wherein the controller is further configured to generate first and second control signals such that the first control signal is activated when the processing circuitry operates in the first mode, and deactivated when the processing circuitry operates in the second and third modes, and the second control signal is activated when the processing circuitry operates in the second mode, and deactivated when the processing circuitry operates in the first and third modes, wherein the pull-down circuit and the common-mode circuit are further coupled with the controller, and further configured to receive the first and second control signals, respectively, and wherein the pull-down circuit and the common-mode circuit are activated when the first and second control signals are activated, respectively, and deactivated when the first and second control signals are deactivated, respectively.

16. The SoC of claim 14, wherein the controller is further coupled with the clock circuit and the digital circuitry, and further configured to:
  generate a status signal based on the third clock signal, wherein the status signal indicates whether the mode of operation of the external oscillator matches a mode of operation of the processing circuitry; and
  provide the status signal to the digital circuitry, wherein the digital circuitry executes the one or more synchronous operations further based on the status signal.

17. The SoC of claim 16, wherein to detect the mode of operation of the external oscillator, the controller is further configured to:
  initialize the processing circuitry to operate in the first mode;
  receive the third clock signal outputted when the processing circuitry operates in the first mode; and
  determine, based on the received third clock signal, whether the external oscillator is operating in the first mode, wherein when the controller determines that the external oscillator is operating in the first mode, the status signal is activated to indicate that the processing circuitry is operating in a same mode as that of the external oscillator.

18. The SoC of claim 17, wherein to detect the mode of operation of the external oscillator, the controller is further configured to:
  initialize the processing circuitry to operate in the second mode when the controller determines that the external oscillator is not operating in the first mode;
  receive the third clock signal outputted when the processing circuitry operates in the second mode; and
  determine, based on the received third clock signal, whether the external oscillator is operating in the second mode, wherein when the controller determines that the external oscillator is operating in the second mode, the status signal is activated to indicate that the processing circuitry is operating in a same mode as that of the external oscillator.

19. The SoC of claim 18, wherein to detect the mode of operation of the external oscillator, the controller is further configured to:
  initialize the processing circuitry to operate in the third mode when the controller determines that the external oscillator is not operating in the second mode;
  receive the third clock signal outputted when the processing circuitry operates in the third mode; and
  determine, based on the received third clock signal, whether the external oscillator is operating in the third mode, wherein when the controller determines that the external oscillator is operating in the third mode, the status signal is activated to indicate that the processing circuitry is operating in a same mode as that of the external oscillator.

20. An electronic circuit board, comprising:
an external oscillator that is configured to operate in one of first through third modes, and generate at least one of first and second clock signals, wherein the first through third modes correspond to single-ended, differential, and crystal modes, respectively; and
an enabling system that is coupled with the external oscillator, and configured to enable the external oscillator, the enabling system comprising:
  a controller that is configured to detect a mode of operation of the external oscillator; and
  processing circuitry that is coupled with the controller, and configured to operate in the detected mode for enabling the external oscillator, the processing circuitry comprising:
    a clock circuit that is coupled with the external oscillator, and configured to receive at least one of the first and second clock signals, and output a third clock signal;
    a pull-down circuit that is coupled between the external oscillator and ground, and configured to receive and pull down the second clock signal to ground, wherein the pull-down circuit is activated when the processing circuitry operates in the first mode, and deactivated when the processing circuitry operates in the second and third modes; and a common-mode circuit that is coupled with the clock circuit, and configured to generate and provide a common-mode voltage to the clock circuit, wherein the third clock signal is further outputted by the clock circuit based on the common-mode voltage, and wherein the common-mode circuit is activated when the processing circuitry operates in the second mode, and deactivated when the processing circuitry operates in the first and third modes.

* * * * *